United States Patent [19]

Heys, Jr. et al.

[11] Patent Number: 5,600,539
[45] Date of Patent: Feb. 4, 1997

[54] SECURE INTERFACE CARD EXTRACTOR/EJECTOR MECHANISM

[75] Inventors: George Heys, Jr., Dacula; Horng J. Lin, Lawrenceville; Brian A. Wong Shui, Atlanta; Andrew C. Zeik, Duluth, all of Ga.

[73] Assignee: AT&T Global Information Solutions Company, Dayton, Ohio

[21] Appl. No.: 321,198

[22] Filed: Oct. 11, 1994

[51] Int. Cl.⁶ .............................. H05K 7/14; G06F 1/16
[52] U.S. Cl. .................... 361/684; 361/725; 361/726; 439/928.1
[58] Field of Search ................... 361/686, 684, 361/685, 737, 818, 725–727, 730, 732, 742–747, 753–754, 756, 758–759, 816; 235/380, 472, 492, 495; 364/708.1; 174/35 R, 35 GC, 51; 439/928.1, 945, 607, 610

[56] References Cited

U.S. PATENT DOCUMENTS

| | | |
|---|---|---|
| Re. 34,369 | 9/1993 | Darden et al. . |
| 3,869,185 | 3/1975 | Teagno . |
| 3,913,136 | 10/1975 | Kelch et al. . |
| 4,397,513 | 8/1983 | Clark et al. ............... 439/928.1 |
| 4,780,793 | 10/1988 | Ohtsuki ........................ 361/737 |
| 4,941,841 | 7/1990 | Darden et al. ............... 439/377 |
| 5,026,296 | 6/1991 | Hashiguchi . |
| 5,033,972 | 7/1991 | Komatsu et al. . |
| 5,038,023 | 8/1991 | Saliga . |
| 5,107,404 | 4/1992 | Tam ............................ 361/818 |
| 5,234,351 | 8/1993 | Dixon .......................... 439/160 |
| 5,299,944 | 4/1994 | Larabell et al. ............ 439/928.1 |
| 5,333,100 | 7/1994 | Anhalt et al. .................. 361/818 |
| 5,339,222 | 8/1994 | Simmons et al. .............. 361/818 |
| 5,340,340 | 8/1994 | Hastings et al. .............. 361/727 |
| 5,383,098 | 1/1995 | Ma et al. ..................... 361/818 |

FOREIGN PATENT DOCUMENTS 9100681  1/1991  WIPO .................. 361/684

Primary Examiner—Leo P. Picard
Assistant Examiner—Lynn D. Field
Attorney, Agent, or Firm—Albert L. Sessler, Jr.; Paul W. Martin

[57] ABSTRACT

A drawer slide which is capable of moving in and out of the housing of a computer or other electronic apparatus is configured to receive an interface card which is connected into the circuitry of the computer when the drawer slide is in a fully inserted position. The drawer slide rides in a drawer guide which is secured to the computer structure. An interface connector is mounted on the drawer guide and engages a connector on the interface card for connecting the interface card to the remainder of the computer circuitry. A key lock mechanism prevents unauthorized movement of the drawer slide and the associated interface card out of the computer housing.

1 Claim, 3 Drawing Sheets

SECURE INTERFACE CARD EXTRACTOR/EJECTOR MECHANISM

BACKGROUND OF THE INVENTION

The present invention relates to a mechanism in an electronic apparatus for retaining an interface card, and more particularly relates to such a mechanism for extracting and ejecting an interface card and for securing the interface card within the electronic apparatus.

The market for interface cards has experienced recent substantial growth. This has been due to the rapid growth in the use of personal computers, personal digital assistants, personal organizers, pin pads and similar products. Interface card standards such as the ones defined by the Personal Computer Memory Card International Association (PCMCIA) have standardized the market.

These interface cards, when used in a secure computer system, such as a retail terminal, present an opportunity for a possible security breach. The security breach is a direct result of the ease of removal of the interface card.

Most mechanisms currently available on the market provide primarily the extractor/ejector functions. In one instance, the eject functionality of the mechanism is disabled through the use of solenoids in order to provide a degree of security. However the mechanism provided does not prevent the card from being extracted by holding the end of the card.

It would accordingly be helpful to provide a mechanism through which an interface card may be extracted from a connector within an electronic apparatus, such as a computer, while still securing the card against extraction by an unauthorized person.

SUMMARY OF THE INVENTION

The present invention provides a mechanism by which an interface card may be secured within an electronic apparatus such as a computer by means of a key lock, while also providing a mechanism by which the interface card may be extracted from an electrical connector within the apparatus in an ergonomic and accessible manner.

It is accordingly an object of the present invention to provide an interface card module which is secure, user friendly and cost effective.

Another object is to provide an interface card module which includes an extractor/ejector mechanism and a key lock mechanism for securing an interface card against unauthorized removal from an electronic apparatus.

Additional benefits and advantages of the present invention will become apparent to those skilled in the art to which this invention relates from the subsequent

DETAILED DESCRIPTION

Figure 1:
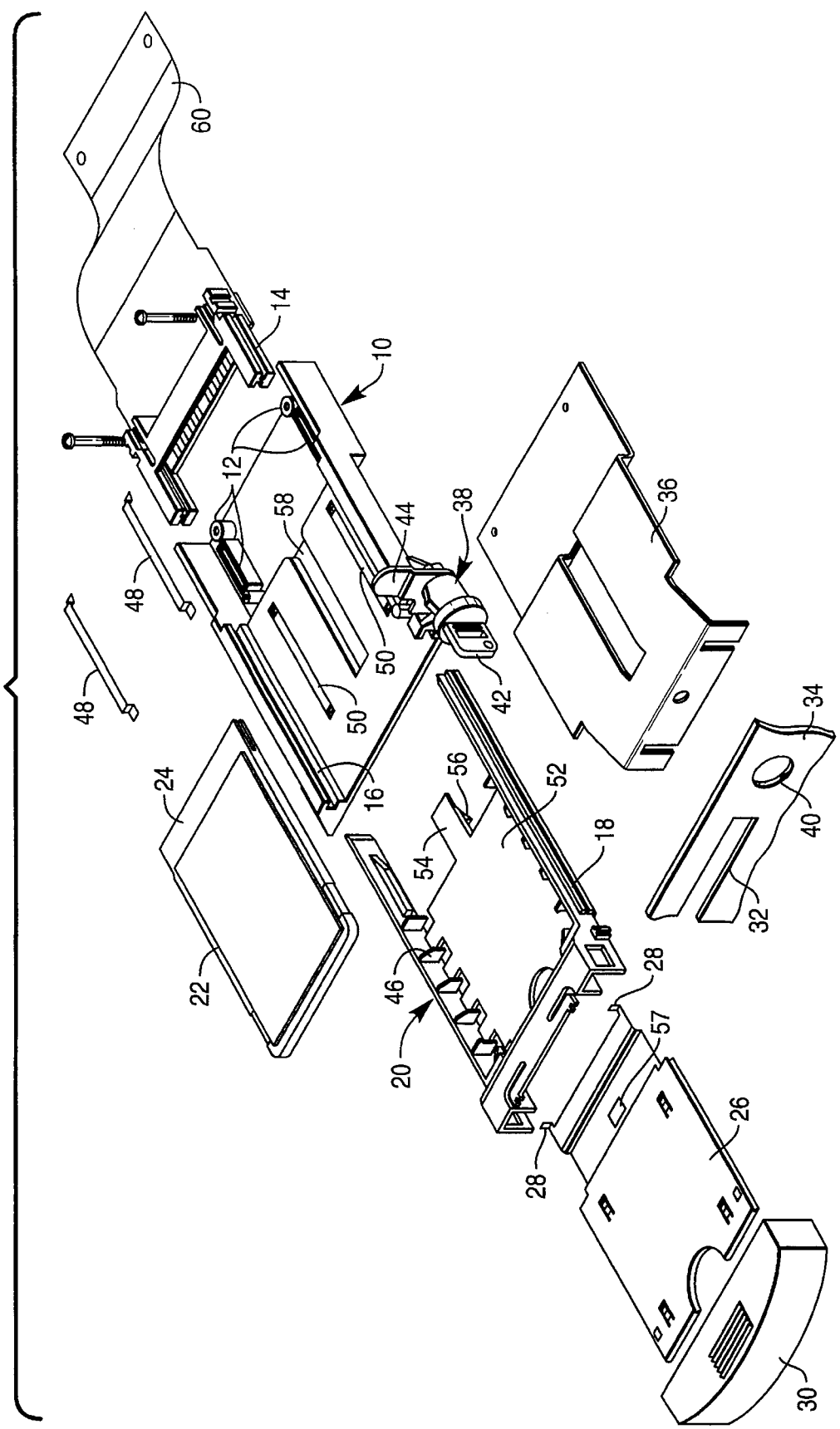
FIG. 1 is a partially exploded view, showing the various parts of the secure interface card extractor/ejector mechanism.
Figure 2:
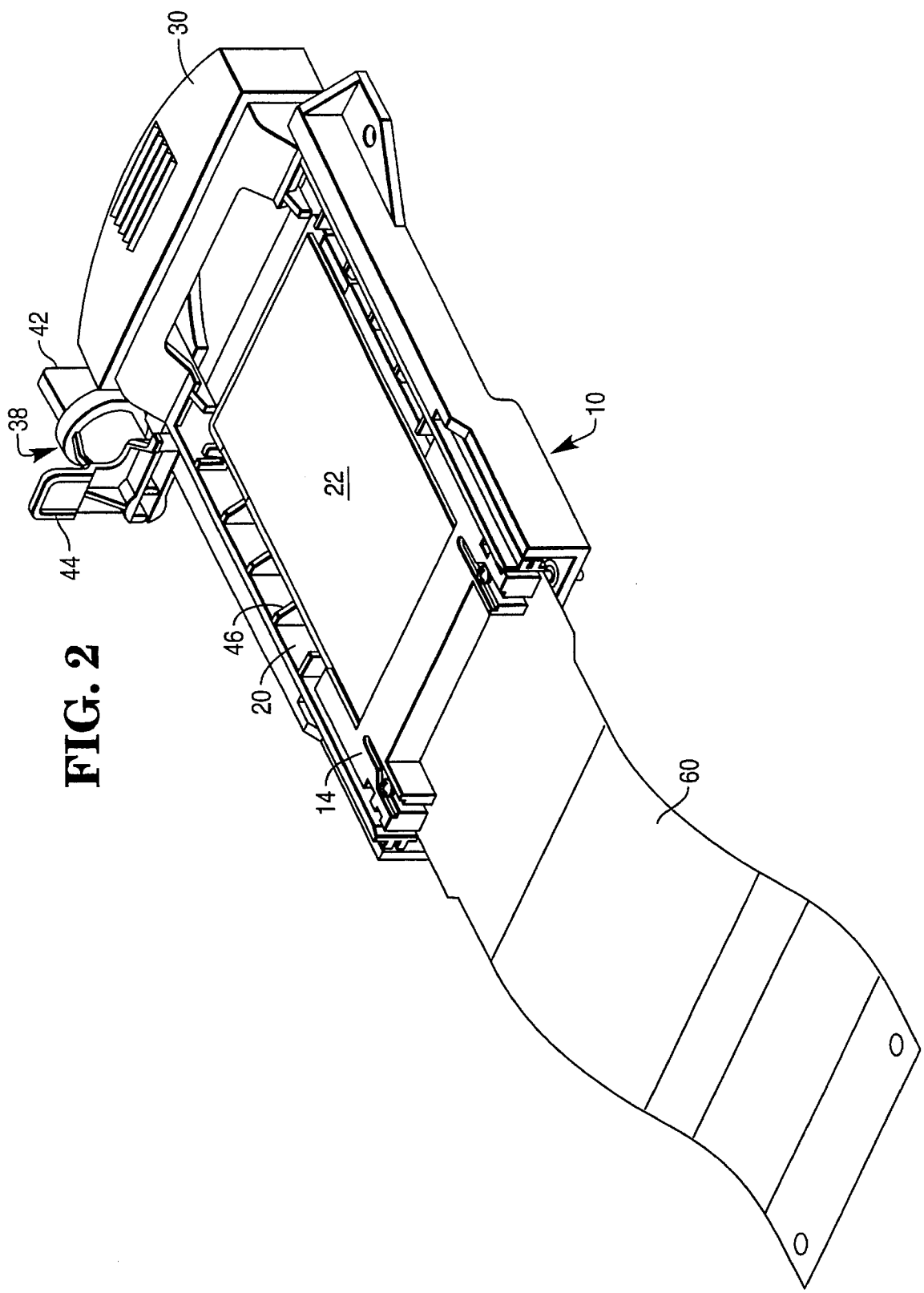
FIG. 2 is a rear perspective view, showing the parts of FIG. 1 in assembled relation.
Figure 3:
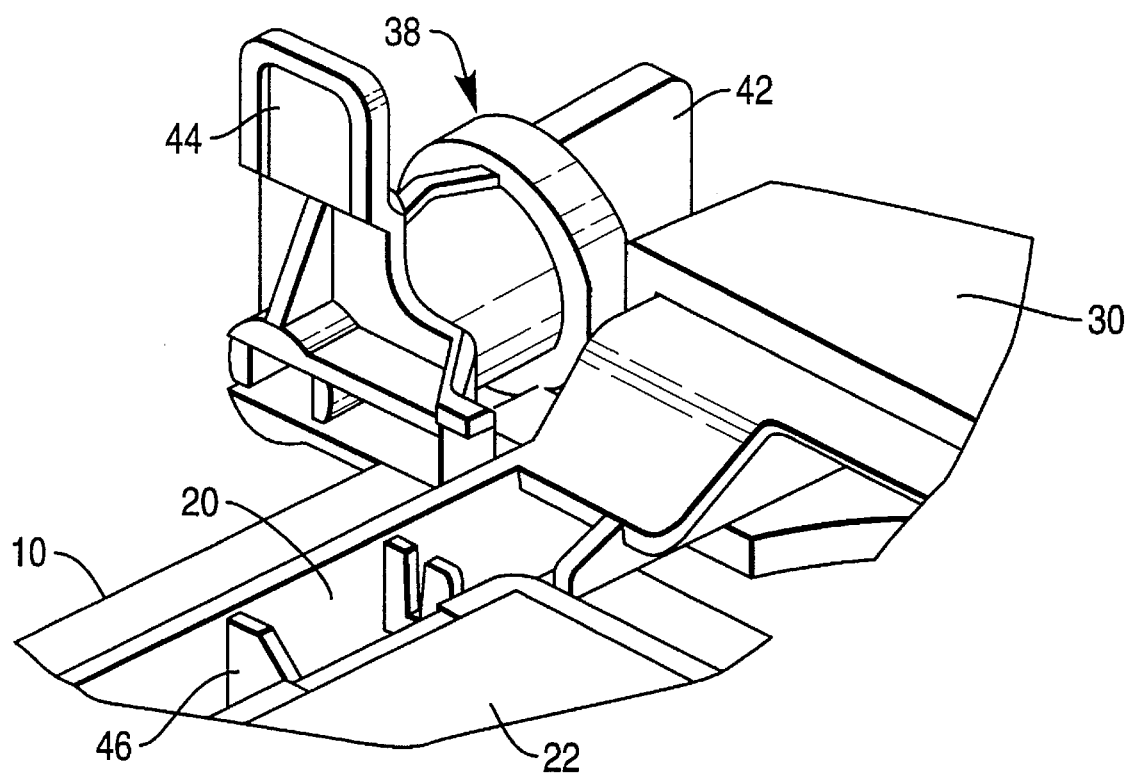
FIG. 3 is an enlarged fragmentary perspective detail view of the key lock mechanism.

Referring now to FIG. 1, a drawer guide 10 is the main support of the mechanism and is normally secured to a frame or inner surface of the housing of an electronic apparatus such as a computer. It provides mounting surfaces 12 to which a PCMCIA connector 14 is attached. The drawer guide 10 also provides a pair of tracks 16 within which rails 18 of a drawer slide 20 are received for sliding movement of the drawer slide 20 with respect to the drawer guide 10.

The sliding movement of the drawer slide 20 results in the insertion and extraction of an interface card 22, which is carried by the drawer slide 20, and which may be a PCMCIA standard interface card, a memory card, a modem card, a hard drive card or a card for any other removable peripheral. At one end, the interface card 22 is provided with an electrical connector 24 which engages the connector 14 on the drawer guide 10 when the drawer slide 20 is in its fully inserted position.

Included as part of the drawer slide 20 is a ground plate 26 which provides electrostatic discharge (ESD) protection for the electronics encased in the interface card 22. The ground plate 26 provides a conductive path from the point of discharge to the frame ground of the computer system or other electronic apparatus. The ground plate 26 also includes fingers 28 which extract the interface card 22 from the interface connector when the drawer slide is moved outwardly for removal of the interface card 22.

A drawer front 30 is secured to the outer end of the drawer slide 20 and may be grasped and pulled when the interface card 22 is to be extracted. When the drawer slide 20 is in its fully inserted position, the drawer front 30 is positioned in a suitably shaped and dimensioned opening 32 in a cabinet front 34 which forms part of the external housing of the computer or other electronic apparatus. The drawer guide 10 may be secured to the cabinet front 34 by a bracket 36.

A key lock mechanism 38 is secured to the cabinet front 34 and partially extends through a circular opening 40 in the cabinet front 34 to provide access to a key 42 for operating the key lock mechanism 38. If desired, the key lock mechanism 38 could alternatively be secured to the drawer guide 10. Included in the key lock mechanism 38 is a lock cam 44 which is rotated by movement of the key 42. In locked position of the key lock mechanism 38, the lock cam 44 engages cooperating slots in the drawer guide 10 and the drawer slide 20, and prevents relative movement between the two, thus locking the drawer slide 20, with the interface card 22 positioned therein, in fully inserted position. This prevents extraction of the interface card 22 by anyone who does not have a proper key 42, and provides the desired security with respect to said card. Rotation of the key 42 to a position in which the cam 44 is out of engagement with the cooperating slots in the drawer guide 10 and the drawer slide 20 permits the drawer slide 20 to be moved outwardly, clear of the cabinet front 34, for removal and/or replacement of the interface card 22.

As has previously been indicated, the drawer slide 20 and the ground plate 26 provide a cradle for the interface card 22. A plurality of ribs 46 on the drawer slide 20 assure proper positioning of the interface card 22 in the drawer slide 20.

A pair of spring members 48 fit within slots 50 of the drawer guide 10 and provide bearing surfaces for a lower element 52 of the drawer slide 20. The spring members 48 also serve to electrically connect the ground plate 26 to the cabinet of the computer or other electronic apparatus via the mounting bracket 36. This electrically connects the ground plate 26 to frame ground to provide electrostatic discharge (ESD) protection. If desired, a conductive plastic material could also be used.

An extension 54 of the lower element 52 has a hook 56 at its end. The hook 56 extends through an aperture 57 in the ground plate 26 and coacts with a track 58 which extends partially along the lower portion of the drawer guide 10 to limit outward movement of the drawer slide 20 with respect to the drawer guide 10, thus preventing the drawer slide 10 from being pulled completely out of the computer or other electronic apparatus.

A flexible electronic circuit or cable 60 connects the connector 14 to a processor board or other circuit board in the computer or other electronic apparatus, and thus carries signals between said board and said connector. Use of such a circuit or cable permits flexibility in mechanical mounting schemes within a computer or other electronic apparatus or system. A hard connector may be used in lieu of the flexible circuit or cable to carry the interface signals between the interface connector 14 and the remaining circuitry.

Although the invention has been described with particular reference to preferred embodiments thereof, variations and modifications of the present invention can be effected within the spirit and scope of the following claims.

What is claimed is:

1. Apparatus for retaining and securing removable interface cards in a data processing device, comprising:

a drawer guide mounted within the data processing device and having a support surface, a connector mount and a pair of tracks;

an electrical connector mounted on said connector mount;

a drawer slide having rails which ride in the tracks of said drawer guide;

wherein said drawer guide and said drawer slide are provided with interlocking elements to prevent the drawer slide from being accidentally removed from the drawer guide, including a stop in the drawer guide and a hook on the drawer slide;

an interface card containing electronic circuitry positioned in said drawer slide and having an electrical connector at one end engageable with said electrical connector on the connector mount; and a ground plate positioned on said drawer slide adjacent to said interface card for providing electrostatic discharge protection for the electronic circuitry contained in the interface card;

wherein the hook on the drawer slide extends through an aperture in the ground plate.

* * * * *